United States Patent
Hernes et al.

(10) Patent No.: US 8,217,824 B2
(45) Date of Patent: Jul. 10, 2012

(54) ANALOG-TO-DIGITAL CONVERTER TIMING CIRCUITS

(75) Inventors: Bjornar Hernes, Trondheim (NO); Frode Telsto, Trondheim (NO); Terje Nortvedt Andersen, Trondheim (NO)

(73) Assignee: Arctic Silicon Devices, AS, Tiller (NO)

( * ) Notice: Subject to any disclaimer, the term of this patent is extended or adjusted under 35 U.S.C. 154(b) by 58 days.

(21) Appl. No.: 12/664,453

(22) PCT Filed: Dec. 10, 2008

(86) PCT No.: PCT/IB2008/003947
§ 371 (c)(1),
(2), (4) Date: Jul. 20, 2010

(87) PCT Pub. No.: WO2009/090496
PCT Pub. Date: Jul. 23, 2009

(65) Prior Publication Data
US 2011/0309962 A1    Dec. 22, 2011

Related U.S. Application Data

(60) Provisional application No. 61/013,498, filed on Dec. 13, 2007.

(51) Int. Cl.
*H03M 1/38* (2006.01)
(52) U.S. Cl. .................... 341/161; 341/155; 341/162
(58) Field of Classification Search ........... 341/161–162
See application file for complete search history.

(56) References Cited

U.S. PATENT DOCUMENTS

| 5,249,214 | A |   | 9/1993  | Ulmer et al. |
|-----------|---|---|---------|--------------|
| 6,184,809 | B1 |   | 2/2001  | Yu |
| 6,195,032 | B1 |   | 2/2001  | Watson et al. |
| 6,246,278 | B1 |   | 6/2001  | Anderson et al. |
| 6,323,800 | B1 | * | 11/2001 | Chiang .......... 341/161 |
| 6,337,651 | B1 | * | 1/2002  | Chiang .......... 341/161 |
| 6,366,230 | B1 |   | 4/2002  | Zhang et al. |
| 6,369,744 | B1 |   | 4/2002  | Chuang |
| 6,396,429 | B2 |   | 5/2002  | Singer et al. |
| 6,600,440 | B1 |   | 7/2003  | Sakurai |
| 6,617,992 | B2 |   | 9/2003  | Sakurai |
| 6,686,860 | B2 |   | 2/2004  | Gulati et al. |
| 6,744,395 | B1 |   | 6/2004  | Perelman et al. |
| 6,784,814 | B1 |   | 8/2004  | Nair et al. |
| 6,784,824 | B1 |   | 8/2004  | Quinn |
| 6,864,822 | B2 |   | 3/2005  | Gulati et al. |
| 6,894,631 | B1 |   | 5/2005  | Bardsley |
| 6,963,300 | B1 |   | 11/2005 | Lee |

(Continued)

OTHER PUBLICATIONS

International Search report and Written Opinion for IB2008/003947, dated Jun. 20, 2011.

(Continued)

*Primary Examiner* — Khai M Nguyen
(74) *Attorney, Agent, or Firm* — Rajesh Vallabh; Foley Hoag LLP

(57) ABSTRACT

An analog-to-digital converter timing circuit disclosed herein uses a clock generation circuit that makes the analog-to-digital converter insensitive to input clock duty cycle. Minimum clock jitter is added to the clock signal while propagating through the disclosed circuit. A method and system are also disclosed to clock an interleaved pipelined ADC such that the operation is insensitive to input clock duty cycle and such that the clock jitter on the sampling clock edges is minimized.

14 Claims, 4 Drawing Sheets

U.S. PATENT DOCUMENTS

| | | | |
|---|---|---|---|
| 6,975,950 B2 | 12/2005 | Bardsley | |
| 7,002,501 B2 | 2/2006 | Gulati et al. | |
| 7,187,318 B1 | 3/2007 | Lee et al. | |
| 7,233,276 B1 | 6/2007 | Huang et al. | |
| 7,268,720 B1 | 9/2007 | Murden et al. | |
| 7,280,064 B2 | 10/2007 | Lin et al. | |
| 7,283,083 B1 * | 10/2007 | Kamal et al. | 341/161 |
| 7,339,512 B2 | 3/2008 | Gulati et al. | |
| 7,649,957 B2 * | 1/2010 | Garrity et al. | 375/280 |
| 7,746,255 B1 * | 6/2010 | Huang | 341/122 |
| 7,760,117 B1 * | 7/2010 | Chou | 341/136 |
| 7,903,017 B2 * | 3/2011 | Hsieh et al. | 341/161 |
| 2003/0020554 A1 | 1/2003 | Lin | |
| 2004/0017224 A1 | 1/2004 | Tumer et al. | |
| 2007/0247348 A1 | 10/2007 | Rezayee et al. | |

OTHER PUBLICATIONS

Gupta, et al. "A 1GS/s 11b Time-Interleaved ADC in 0.1313mm CMOS", IEEE International Solid State Circuits Conference Digest of Technical Papers, pp. 576-577, Feb. 2006.

Vital, et al., "A concurrent Two-Step Flash Analogue-To-Digital Converter Architecture," IEEE International Symposium on Circuits and Systems 1993, pp. 1196-1199.

* cited by examiner

ANALOG-TO-DIGITAL CONVERTER TIMING CIRCUITS

BACKGROUND

1. Technical Field

This disclosure generally relates to analog-to-digital converters and more specifically to sub-quantizer architectures for analog-to-digital converters.

2. Description of the Related Art

Common design architectures for analog to digital converters (ADCs) are the so-called "pipelined architectures." For many applications, a pipelined architecture scheme is preferable because it provides optimum power dissipation characteristics. In addition, there are other available architectures that resemble a pipelined architecture because the same principle building blocks are employed.

FIG. 1 illustrates a typical pipelined ADC. The architecture consists of several pipeline stages, each resolving a number of bits. The number of bits can be different for each stage, but for simplicity of explanation, all stages are considered equal. The input signal is applied to the first pipeline stage. A number of bits are extracted in the first stage by the sub-ADC, the input signal is sampled in parallel and the analog value corresponding to the output bits is subtracted from the input voltage. The residual signal, called the "residue," is amplified with a factor dependent on the number of bits extracted and passed on to the next stage. The process is repeated in the consecutive stages. The digital output from each stage is processed in a digital correction logic block and combined into an n-bit output data word.

Several prior art techniques have been used to improve power dissipation of pipelined ADCs. The two papers explain a technique that is shown to significantly reduce power dissipation: (1) Gupta et al., *A 1 GS/s 11b Time-Interleaved ADC in 0.13 um CMOS*, 2006 Digest of Technical Papers, ISSCC 2006, session 31.6; and (2) Vital et al., *A Concurrent Two-Step Flash Analogue-To-Digital Converter Architecture*, ISCAS apos; 93, 1993 IEEE International Symposium, May 3-6, 1993, pp. 1196-1199, vol. 2.

These papers disclose a technique wherein the operational transconductance amplifiers (OTA) are shared between the several stages of the ADC. In an ordinary pipelined ADC implementation, the OTA is used only half of the time and is active for only half of each clock cycle. By sharing the OTA between two pipeline channels running in antiphase, or in opposite phases with one another, the OTA can be utilized all the time. Using the OTA all the time results in significant power dissipation savings. The principle of OTA sharing is shown in Gupta et al. while an actual implementation of a shared OTA is shown in Vital et al. This architecture that features OTA sharing is commonly called an "interleaved ADC."

FIG. 2 shows an implementation of a single pipeline stage according to the interleaved ADC solution in accordance with one or more embodiments. In this implementation, the ADC consists of two parallel channels implemented in each pipeline stage. The inputs to the two channels are shorted such that the same signal is propagated through each channel. Alternatively, the two channels could be kept separate, implementing two parallel independent channels. The channels work in antiphase such that one channel is in hold mode when the other channel is in sampling mode.

The operation of the technique of OTA sharing implemented in a pipeline stage is as follows. The input signal to the stage is applied to two channels, 100 and 101. When channel 100 starts in track-mode and channel 101 is in hold-mode, the input signal is applied to the sub-ADC 1 of channel 100 in parallel to a sampling network. The sub-ADC 1 quantizes the input signal and outputs N bits at the end of the track-phase. These N bits are converted back to an analog voltage by the DAC 2, to be used in the hold-phase. During the track-phase, all switches labeled "T" are closed. These switches are opened at the end of the track-phase sampling the input voltage on the sampling capacitors $C_S$ and $C_H$. In the hold-phase, the switches labeled "H" are closed. This closes the loop around the amplifier comprising of the OTA input stage 3 and the OTA output stage 4, and the input voltage is amplified and held on the stage output terminal. The DAC output voltage is also subtracted from the output through the capacitive feedback network of $C_S$ and $C_H$. This functionality is equal to an ordinary pipeline stage.

When the channel 100 is in the track-phase, the channel 101 may be in hold-phase. When the two channels switch phases, the OTA output stage 4 switches operation from one channel (e.g. 100) to the other (e.g. 101). Therefore, the OTA output stage 4 is active 100% of the time while it is idle during the track-phase of an ordinary pipeline stage. In FIG. 2, the OTA input stages 3, 3a will be idle during the track-phase of their respective channels 100, 101. However, in a typical implementation, most of the current from both channels 100, 101 flows through the OTA output stage 4, thereby providing the benefit of sharing the OTA output stage between the two channels 100, 101.

To further reduce power dissipation, it is possible to switch off the current in the OTA input stages 3 or 3a when the respective channel 100, 101 is in the track-phase. This would typically be implemented as a fixed bias current that is steered to one of the OTA input stages 3, 3a based on the clock signals controlling whether the channel 100, 101 is in track-phase or hold-phase. This would result in a bias current that is half of the bias current of a traditional solution.

A major challenge using such an OTA sharing principle is the generation of the necessary timing pulses for correct operation and accurate clocking of the pipeline stages. For high resolution ADCs, it is critical to generate a sampling clock with sufficiently low phase noise or equivalent clock jitter. In addition, in typical pipelined ADCs, the input clock may have exactly 50% duty cycle in order for the ADC to have full performance.

Therefore, there is a need for new timing circuits with specific characteristics to use with the architectures described above.

SUMMARY OF THE DISCLOSURE

A disclosed timing circuit includes a clock input, two output terminals two flip-flops, four logic NOR gates, two logic AND gates and an inverter. The first flip-flop may be connected with its inverting output back to the input of both the first and the second flip-flop. The non-inverting output of the first flip-flop may be connected to the first input of the first NOR gate and the clock input may be connected to the second input of the NOR gate.

The output of the first NOR gate may be connected to the first input of the second NOR gate. The inverting output of the second flip flop may be connected to the first input of the first AND gate. The clock input may be connected to the second input of the first AND gate. The output of the AND gate may be connected to the second input of the second NOR gate. The non-inverting output of the second flip-flop may be connected to the first input of the second AND gate, and the clock input may be connected to the second input of the second AND gate. The output of the second AND gate may be connected to the second input of the fourth NOR gate. The inverting output of the first flip-flop may be connected to the first input of the third NOR gate. The clock input may be connected to the second input of the third NOR gate. The output of the third NOR gate may be connected to the first input of the fourth NOR gate. The clock input may be connected to the clock input of the first flip-flop and to the input of the inverter.

The output of the inverter may be connected to the clock input of the second flip-flop. The output of the second NOR gate may be connected to the first output terminal and the output of the fourth NOR gate may be connected to the second output terminal. The first and the second output terminals are utilized in an interleaved analog-to-digital converter such that only rising edges of the input clock may be utilized for analog circuitry. As a result, the analog-to-digital converter can be insensitive to input clock duty cycle. Further, a minimum clock jitter may be added to the clock signal while it is propagating through the disclosed circuit.

Thus, a method of clocking of an interleaved pipelined converter is disclosed wherein only one edge of the input clock may be used to control analog circuitry of the interleaved pipelined converter.

Other advantages and features will be apparent from the following detailed description when read in conjunction with the attached drawings.

BRIEF DESCRIPTION OF THE DRAWINGS

For a more complete understanding of the disclosed methods and apparatuses, reference should be made to the embodiments illustrated in greater detail in the accompanying drawings, wherein.

It should be understood that the drawings are not necessarily to scale and that the disclosed embodiments are sometimes illustrated diagrammatically and in partial views. In certain instances, details which are not necessary for an understanding of the disclosed methods and apparatuses or which render other details difficult to perceive may have been omitted. It should be understood, of course, that this disclosure is not limited to the particular embodiments illustrated herein.

DETAILED DESCRIPTION OF THE PRESENTLY PREFERRED EMBODIMENTS

A method and system are disclosed to clock an interleaved pipelined ADC such that the operation is insensitive to input clock duty cycle and such that the clock jitter on the sampling clock edges is minimized.

Figure 1:
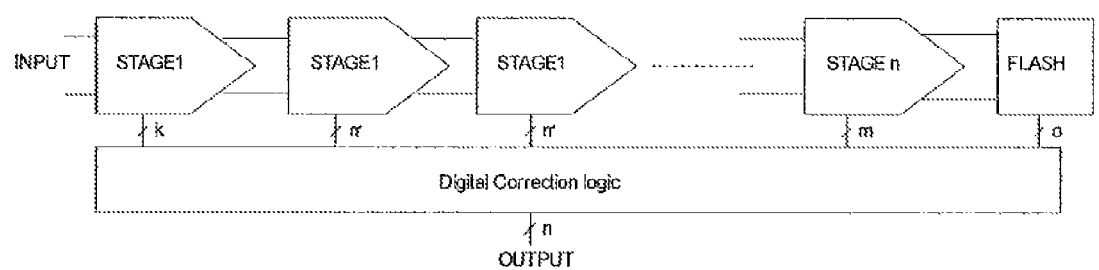
FIG. 1 illustrates a typical block diagram of a prior art pipelined ADC.
Figure 2:
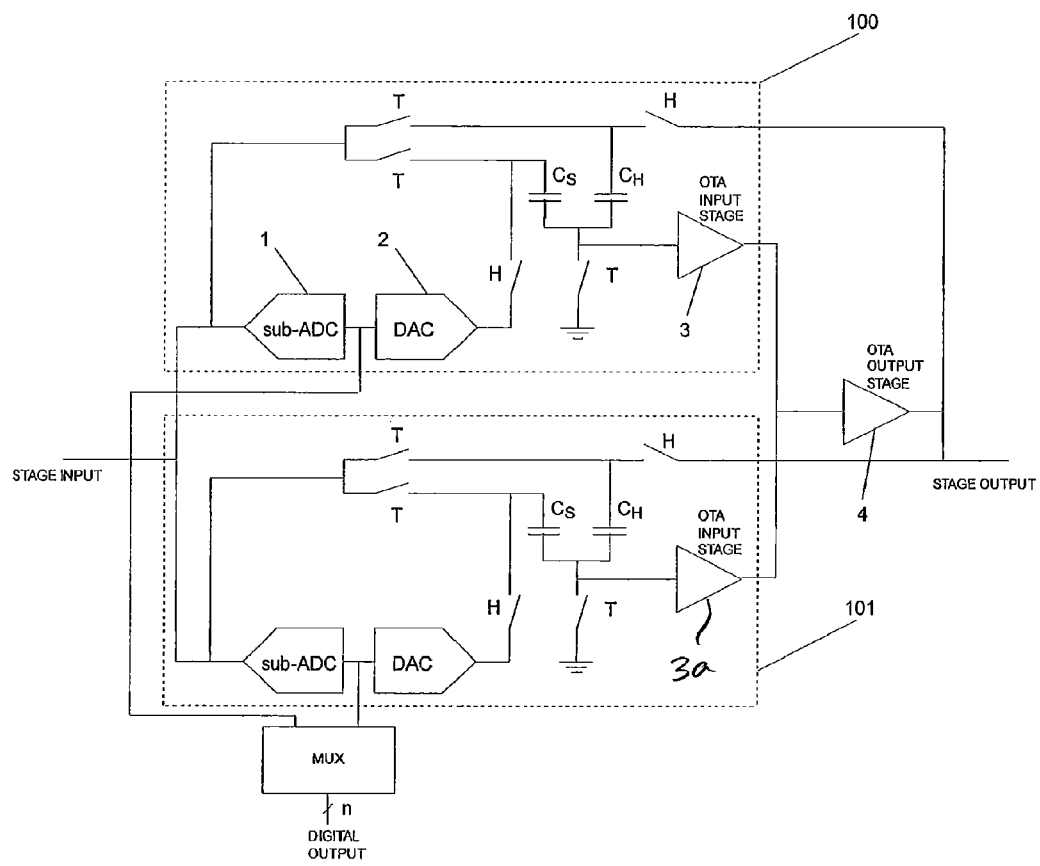
FIG. 2 schematically illustrates a block diagram of a pipeline stage where the OTA is shared between stages in parallel pipeline chains.
Figure 3:
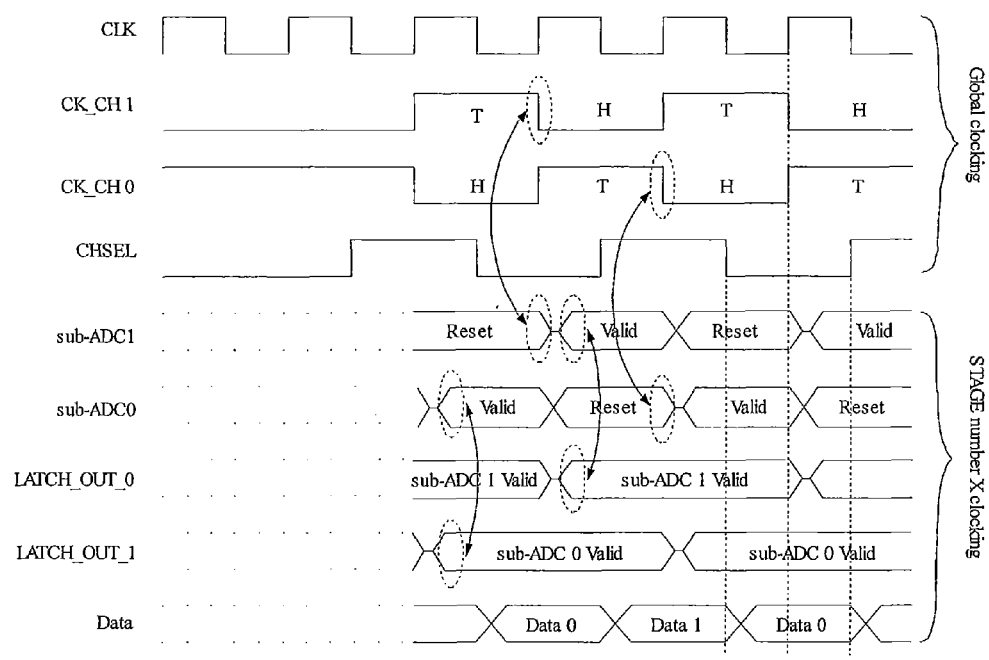
FIG. 3 illustrates a disclosed timing diagram that illustrates the necessary clocks for operation independent of the input clock duty cycle.

As shown in FIG. 3, the input clock CLK to the ADC is a clock running at the sample rate similar to a prior art pipelined ADC. Half rate clock signals may be generated because each of the channels is running at half the clock rate. These divided down clocks are shown as CK_CH 1 and CK_CH 0 in FIG. 3. These clocks may be used internal to each pipeline stage to generate local control signals for the T and H switches of FIG. 2. The "T" and "H" labels on the CK_CH 1 and CK_CH 0 signals in FIG. 3 indicate whether the channel is in track mode ("T") or hold mode ("H"). Note that the edges of these signals only exist on rising edges of the input clock. The sub-ADC1 and sub-ADC0 are also latched on the clock edges of CK_CH 1 and CK_CH 0, as shown in FIG. 3. As each channel goes from track-mode to hold-mode, latch signals are sent to the sub-ADC1 or sub-ADC0 and the respective channel goes from the reset-phase to the valid-data-phase. The sub-ADC1 and sub-ADC0 are regenerative elements, and the time taken from the latch pulse is applied until valid data are ready at the output, depends on the input voltage. This is shown in FIG. 3 as a delay between the reset-phase and valid-data-phase. There are also latches L behind the sub-ADC1 and sub-ADC0 that are open (transmitting the input signal directly through) when the respective CK_CH 1 or CK_CH 0 signal is low, and holding the output data when the respective CK_CH 1 or CK_CH 0 signal is high. This gives output data for each channel that are valid for almost the complete clock period of the channel.

Still referring to FIG. 3, the only signal working on the negative edge of the input clock is the channel select signal, CHSEL. The CHSEL signal is used to control multiplexers delivering the digital data from the sub-ADCs (sub-ADC1 and sub-ADC0) to the digital logic block. When CHSEL is low, data from channel 0 (Data 0) is sent to the stage output and when it is high, data from channel 1 (Data 1) is sent to the stage output as shown in FIG. 3. The digital logic block of the pipelined ADC will be running at the full clock rate from the clock signal CLK. The digital logic block will capture data at the rising edge of CLK. These rising edges will typically be in the center of the valid period of Data 0 and Data 1.

In case of an input clock duty cycle different from 50%, the only thing that will happen is that the valid periods of Data 0 and Data 1 are moved back and forth. It is almost half a clock cycle margin both at the LATCH_OUT output and at the input of the digital logic block. The clocking scheme shown is therefore very insensitive to changes in clock duty cycle which is a significant advantage over prior art pipelined ADCs.

Because the sampling instant of the ADC is determined by the clocks CK_CH 1 and CK_CH 0, it is necessary to generate these with as high accuracy and low clock jitter as possible. Any clock jitter added to the input clock will reduce the obtainable performance of the ADC. In standard clock dividers, the clock edge is typically generated through a flip-flop. The signal path of a flip-flop contains several circuit elements, and the transmission delay is relatively long. These two aspects, among others, make the design of very low jitter clock generation circuitry difficult.

Figure 4:
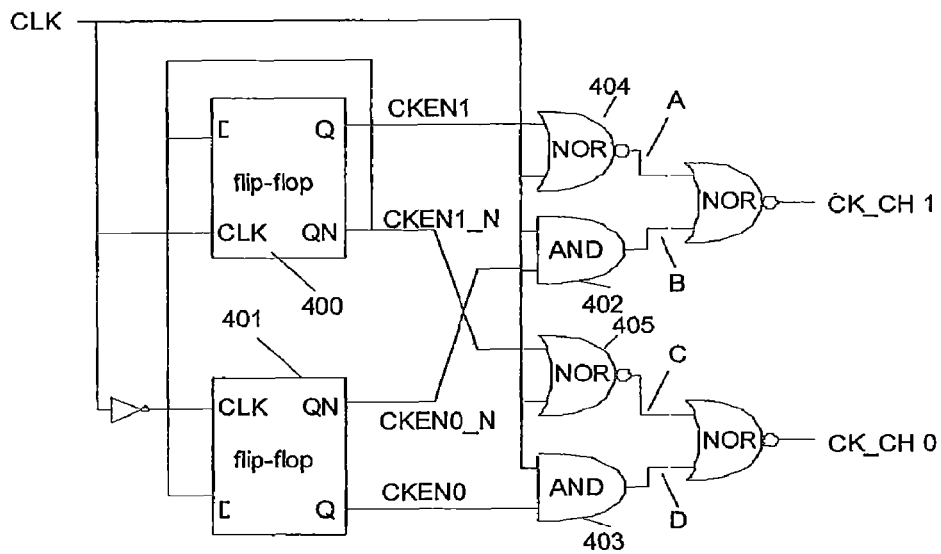
FIG. 4 illustrates a timing generation circuit and a corresponding timing diagram.
Figure 4:
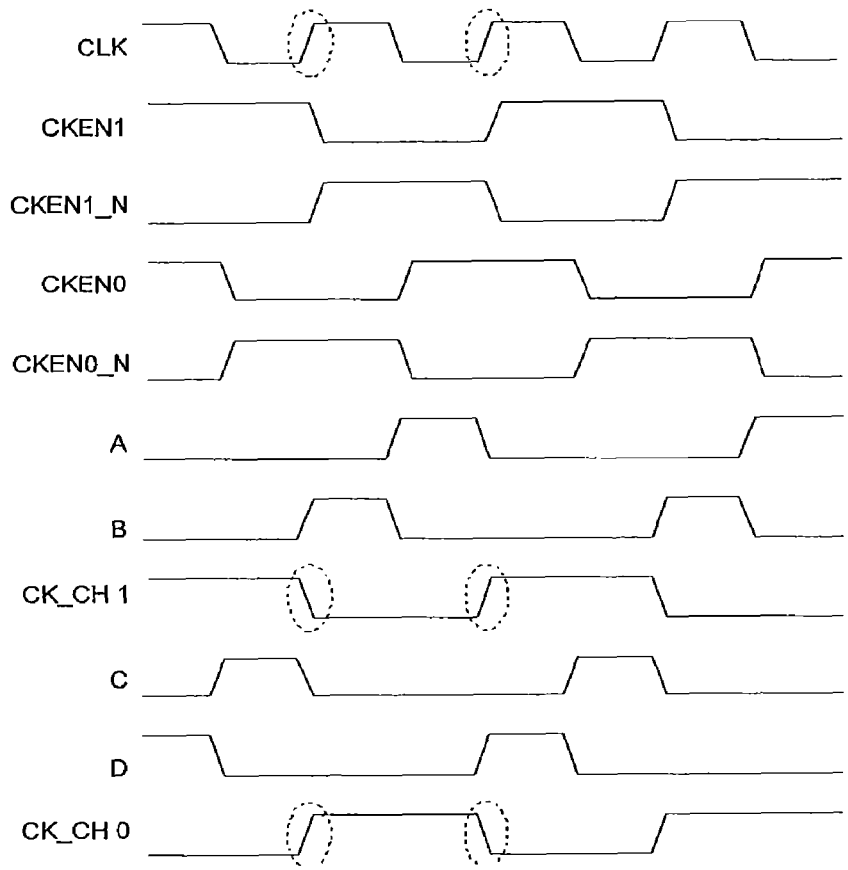

The clock generation circuit shown in FIG. 4 solves this problem. All clock outputs have only two logic elements in the signal path from the main clock input to each of the CK_CH 1 and CK_CH 0 outputs. The functionality of the circuitry in FIG. 4 is as follows:

The top flip-flop 400 in FIG. 4 divides down the input clock frequency to half the rate. The Q and QN outputs from the flip-flops are non-inverting and inverting outputs respectively. Each of the four flip-flop outputs set up enable signals for the logic gates without making any changes in the output signals CK_CH 1 and CK_CH 0. The signals for all nodes are shown in FIG. 4. As soon as the input clock changes polarity, both output signals change within the delay represented by the logic gates, and the flip-flop delay is negligible. The result is that the CK_CH 1 and CK_CH 0 signals change prior to CKEN1 and CKEN1_N. In this way the contribution to clock jitter is minimized from this clock circuit. Only two logic elements, and no flip-flop, are part of the path for the clock through the circuit.

The delays through the logic gates may be dimensioned such that the output signals CK_CH 1 and CK_CH 0 are glitch free. This can be achieved, for example, by ensuring that the delay through the AND gates 402 ad 403 is larger than the delay through the NOR gates 404 and 405. This can also be verified by studying the waveforms of FIG. 4.

Alternatively, the disclosed clock generation circuit may be used in subranging ADCs. Further, the clock generation circuit described above may be used in cyclic ADCs.

While only certain embodiments have been set forth, alternatives and modifications will be apparent from the above description to those skilled in the art. These and other alternatives are considered equivalents and within the spirit and scope of this disclosure and the appended claims.

The invention claimed is:

1. A clock generation circuit comprising:
   a clock input, two output terminals, two flip-flops, four logic NOR gates, two logic AND gates, and an inverter;
   the first flip-flop is connected with its inverting output back to the input of both the first and the second flip-flop;
   a non-inverting output of the first flip-flop being connected to the first input of the first NOR gate and the clock input being connected to the second input of the NOR gate;
   an output of the first NOR gate being connected to the first input of the second NOR gate;
   an inverting output of the second flip flop being connected to the first input of the first AND gate;
   a clock input being connected to the second input of the first AND gate;
   an output of the AND gate being connected to the second input of the second NOR gate;
   a non-inverting output of the second flip-flop being connected to the first input of the second AND gate and a clock input being connected to the second input of the second AND gate;
   an output of the second AND gate being connected to the second input of the fourth NOR gate;
   an inverting output of the first flip-flop being connected to the first input of the third NOR gate;
   the clock input being connected to the second input of the third NOR gate;
   an output of the third NOR gate being connected to the first input of the fourth NOR gate;
   a clock input being connected to the clock input of the first flip-flop and to the input of the inverter;
   an output of the inverter being connected to the clock input of the second flip-flop; and
   an output of the second NOR gate being connected to the first output terminal and the output of the fourth NOR gate being connected to the second output terminal.

2. A subranging ADC comprising a clock generation circuit according to claim 1.

3. A cyclic ADC comprising a clock generation circuit according to claim 1.

4. A pipelined ADC circuitry comprising a clock generation circuit according to claim 1.

5. A clock generation circuit used to clock ADC circuitry, the clock generation circuit comprising:
   an input clock;
   a plurality of output clocks;
   an enabling circuitry to divide a clock rate by two and to generate enable signals toggling on positive clock edges of the input clock and enable signals toggling on negative clock edges of the input clock; and
   a plurality of digital gates to generate the output clocks based on enable signals received from the enabling circuitry and timed only by one edge of the input clock.

6. The clock generation circuit of claim 5, wherein the ADC circuitry comprises double sampling ADCs.

7. The clock generation circuit of claim 5, wherein the ADC circuitry comprises a subranging ADC.

8. The clock generation circuit of claim 5, wherein the ADC circuitry comprises a cyclic ADC.

9. The clock generation circuit of claim 5, wherein the ADC circuitry comprises a pipelined ADC.

10. The clock generation circuit of claim 5, wherein the enabling circuitry includes first and second flip-flops and an inverter, and wherein the plurality of digital gates comprises first, second, third, and fourth logic NOR gates and first and second logic AND gates, wherein:
    the first flip-flop is connected with its inverting output back to an input of both the first flip-flop and the second flip-flop;
    a non-inverting output of the first flip-flop is connected to a first input of the first NOR gate, and the clock input is connected to a second input of the first NOR gate;
    an output of the first NOR gate is connected to a first input of the second NOR gate;
    an inverting output of the second flip flop is connected to a first input of the first AND gate;
    a clock input is connected to a second input of the first AND gate;
    an output of the first AND gate is connected to a second input of the second NOR gate;
    a non-inverting output of the second flip-flop is connected to a first input of the second AND gate, and a clock input is connected to a second input of the second AND gate;
    an output of the second AND gate is connected to a second input of the fourth NOR gate;
    an inverting output of the first flip-flop is connected to a first input of the third NOR gate;
    the clock input is connected to a second input of the third NOR gate;
    an output of the third NOR gate is connected to a first input of the fourth NOR gate;
    a clock input is connected to the clock input of the first flip-flop and to the input of the inverter;
    an output of the inverter is connected to the clock input of the second flip-flop; and
    an output of the second NOR gate is connected to a first output terminal and the output of the fourth NOR gate is connected to a second output terminal.

11. A pipelined analog-to-digital converter (ADC) including a plurality of serially connected analog-to-digital pipeline stages, each of the stages comprising:
    a stage input to which an input analog signal to be converted is applied;
    two parallel ADC channels, each channel comprising a sub-ADC for quantizing the input analog signal received at the stage input into a digital signal of a given number of bits, a digital-to-analog converter (DAC) for converting the digital signal to an analog signal, a sampling network for sampling the input analog signal received at the stage input, a subtraction circuit for subtracting the analog signal produced by the DAC from the input analog signal from the sampling network to produce a residual signal, and an input stage operational transconductance amplifier (OTA) for amplifying the residual signal; and
    an OTA output stage for receiving and amplifying the residual signal from the input stage OTA for both of the channels; and a stage output for outputting the residual signal amplified by the OTA output stage, said stage output being coupled to a stage input of a subsequent pipeline stage, if any;

wherein the two parallel ADC channels of each stage work in antiphase such that when one channel is in a hold phase, the other channel is in a track phase, and wherein the channels alternate between hold and track phases, and the OTA output stage switches operation from one channel to another.

12. The pipelined ADC of claim 11, further comprising circuitry for switching bias current in an OTA input stage on and off when the ADC channel containing the OTA input stage is switched between hold and track phases, respectively.

13. The pipelined ADC of claim 11, further comprising a clock generation circuit for generating timing pulses for track and hold phase switching.

14. The pipelined ADC of claim 13, wherein the clock generation circuit comprises:

an input clock;

a plurality of output clocks;

an enabling circuitry to divide a clock rate by two and to generate enable signals toggling on positive clock edges of the input clock and enable signals toggling on negative clock edges of the input clock; and a plurality of digital gates to generate the output clocks based on enable signals received from the enabling circuitry and timed only by one edge of the input clock.

* * * * *